United States Patent
Kim

(10) Patent No.: US 7,881,109 B2
(45) Date of Patent: Feb. 1, 2011

(54) REFRESH CIRCUIT OF SEMICONDUCTOR MEMORY APPARATUS

(75) Inventor: Kyoung Nam Kim, Gyeonggi-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 43 days.

(21) Appl. No.: 12/480,962

(22) Filed: Jun. 9, 2009

(65) Prior Publication Data

US 2010/0157712 A1 Jun. 24, 2010

(30) Foreign Application Priority Data

Dec. 23, 2008 (KR) ...................... 10-2008-0132335

(51) Int. Cl.
*G11C 16/04* (2006.01)

(52) U.S. Cl. .............................. 365/185.11; 365/230.03; 365/185.25; 365/194

(58) Field of Classification Search ............ 365/185.11, 365/230.03, 185.25, 185.19, 203, 194
See application file for complete search history.

(56) References Cited

U.S. PATENT DOCUMENTS 7,145,827 B2 12/2006 Kwak et al.

7,466,621 B2 * 12/2008 Lee ....................... 365/230.06

FOREIGN PATENT DOCUMENTS

| JP | 2006-147123 | 6/2006 |
|---|---|---|
| KR | 1020050101860 | 10/2005 |
| KR | 100834394 | 5/2008 |

* cited by examiner

*Primary Examiner*—Huan Hoang
*Assistant Examiner*—Jason Lappas
(74) *Attorney, Agent, or Firm*—Venable LLP; Jeffri A. Kaminski

(57) ABSTRACT

A refresh circuit of a semiconductor memory apparatus includes a bank active signal generator configured to selectively enable a plurality of bank active signals in response to a piled signal and disable the plurality of bank active signals in response to a plurality of precharge pulses when a refresh signal is enabled; a precharge pulse generator configured to generate a plurality of preliminary precharge pulses in response to the plurality of bank active signals; a delaying unit configured to generate a plurality of preliminary delay precharge pulses by delaying the plurality of preliminary precharge pulses; and a selecting unit configured to selectively output the plurality of preliminary precharge pulses or the plurality of preliminary delay precharge pulses as the plurality of precharge pulses in response to the piled signal.

9 Claims, 2 Drawing Sheets

REFRESH CIRCUIT OF SEMICONDUCTOR MEMORY APPARATUS

CROSS-REFERENCES TO RELATED PATENT APPLICATION

The present application claims priority under 35 U.S.C 119(a) to Korean Application No. 10-2008-0132335, filed on Dec. 23, 2008, in the Korean Intellectual Property Office, which is incorporated herein by reference in its entirety as set forth in full.

BACKGROUND

1. Technical Field

The embodiment described herein relates to a semiconductor memory apparatus and, more particularly, to a refresh circuit.

2. Related Art

A semiconductor memory apparatus, as an apparatus that stores data, must perform an operation of holding and storing the data. The operation of holding and storing the data, which is performed by the semiconductor memory apparatus is referred to as a refresh operation.

The semiconductor memory apparatus does not activate all banks at once in order to reduce peak current at the time of performing the refresh operation. For example, on the basis of 8 banks, a refresh scheme includes a scheme in which 4 banks are activated at one time (2 piled refresh), a scheme in which 2 banks are activated at one time (4 piled refresh), etc.

As shown in FIG. 1, the general refresh circuit can be configured to include a bank active signal generator 10 and a precharge pulse generator 20. The semiconductor memory apparatus having 8 banks is described as one example.

The bank active signal generator 10 can generate first to eighth bank active signals 'BA<0:7>' in response to a refresh signal 'REF' and a piled signal 'T2PILE'. For example, when the refresh signal 'REF' and the piled signal 'T2PILE' are enabled, the bank active signal generator 10 firstly enables the second, fourth, fifth, and seventh bank active signals 'BA<1>', 'BA<3>', 'BA<4>', and 'BA<6>' and thereafter, enables the first, third, sixth, and eighth bank active signals 'BA<0>', 'BA<2>', 'BA<5>', and 'BA<7>', among the first to eighth bank active signals 'BA<0:7>'.

Further, when the refresh signal 'REF' is enabled and the piled signal 'T2PILE' is disabled, the bank active signal generator 10 firstly enables the fourth and fifth bank active signals 'BA<3>' and 'BA<4>', secondly enables the third and sixth bank active signals 'BA<2>' and 'BA<5>', thirdly enables the second and seventh bank active signals 'BA<1>' and 'BA<6>', and lastly enables the first and eighth bank active signals 'BA<0>' and 'BA<7>', among the first to eighth bank active signals 'BA<0>' to 'BA<7>'. Further, when first to eighth precharge pulses 'pre_pulse<0:7>' are inputted, the bank active signal generator 10 disables the corresponding bank active signals 'BA<0:7>'. For example, when the first precharge pulse 'pre_pulse<0>' is inputted, the bank active signal generator 10 disables the first bank active signal 'BA<0>'.

The precharge pulse generator 20 generates each of the first to eighth precharge pulses 'pre_pulse<0:7>' after a set time from the time when each of the first to eighth bank active signals 'BA<0:7>' is enabled.

The general refresh circuit is configured to disable the bank active signal after the set time when the bank active signal is enabled. The refresh circuit operates in the 4 piled refresh scheme in which the refresh operation is performed by activating each of 2 banks among 8 banks or the 2 piled refresh scheme in which the refresh operation is performed by activating each of 4 banks. At this time, the 4 piled refresh scheme in which each of 2 banks among 8 banks is activated has a refresh operation time longer than the 2 piled refresh scheme in which each of 4 banks among 8 banks is activated. The reason for this is that in the 4 piled refresh scheme and the 2 piled refresh scheme, other bank groups are activated when the same time elapses after one-bank groups are activated.

When the semiconductor memory apparatus performs the refresh operation, the longer the activation time of the bank is, the better a refresh characteristic is. However, in the case of the general refresh circuit, the 4 piled refresh scheme has the operation time longer than the 2 piled refresh scheme, while the 4 piled refresh scheme has the same activation time of each bank as the 2 piled refresh scheme. Since the refresh operation time of the semiconductor memory apparatus must be determined on the basis of the standards of the Joint Electron Device Engineering Council (JEDEC), the refresh operation time of the known semiconductor memory apparatus according to the 4 piled refresh scheme having the operation time longer than the 2 piled refresh scheme is designed to suit the standards of the JEDEC. Therefore, the known 2 piled refresh scheme has been adopted with a refresh operation time shorter than the standards of the JEDEC.

SUMMARY

A refresh circuit of a semiconductor memory apparatus that can improve a refresh characteristic at the time of performing a known 2 piled refresh operation is disclosed herein.

In one embodiment, a refresh circuit of a semiconductor memory apparatus includes a bank active signal generator configured to selectively enable a plurality of bank active signals in response to a piled signal and disable the plurality of bank active signals in response to a plurality of precharge pulses when a refresh signal is enabled; a precharge pulse generator configured to generate a plurality of preliminary precharge pulses in response to the plurality of bank active signals; a delaying unit configured to generate a plurality of preliminary delay precharge pulses by delaying the plurality of preliminary precharge pulses; and a selecting unit configured to selectively output the plurality of preliminary precharge pulses or the plurality of preliminary delay precharge pulses as the plurality of precharge pulses in response to the piled signal.

In another embodiment, a refresh circuit of a semiconductor memory apparatus includes a bank active signal generator configured to enable bank active signals in response to a refresh signal and a piled signal and disable the bank active signals in response to precharge pulses; a precharge pulse generator configured to generate preliminary precharge pulses in response to the bank active signals; and a delay selecting unit configured to output the preliminary precharge pulses as the precharge pulses or delay the preliminary precharge pulses to output the preliminary delay precharge pulses as the precharge pulses in response to the piled signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
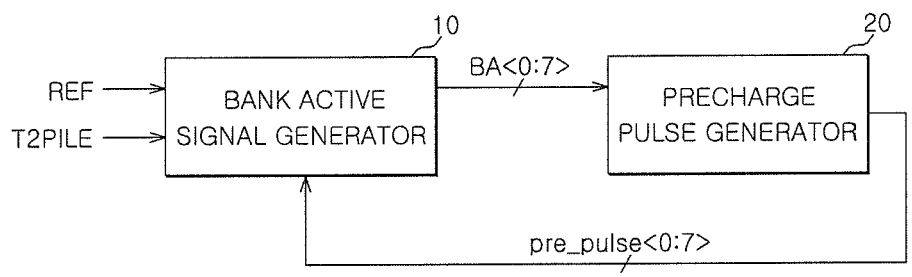
FIG. 1 is a schematic block diagram of a refresh circuit of a general semiconductor memory apparatus.
Figure 2:
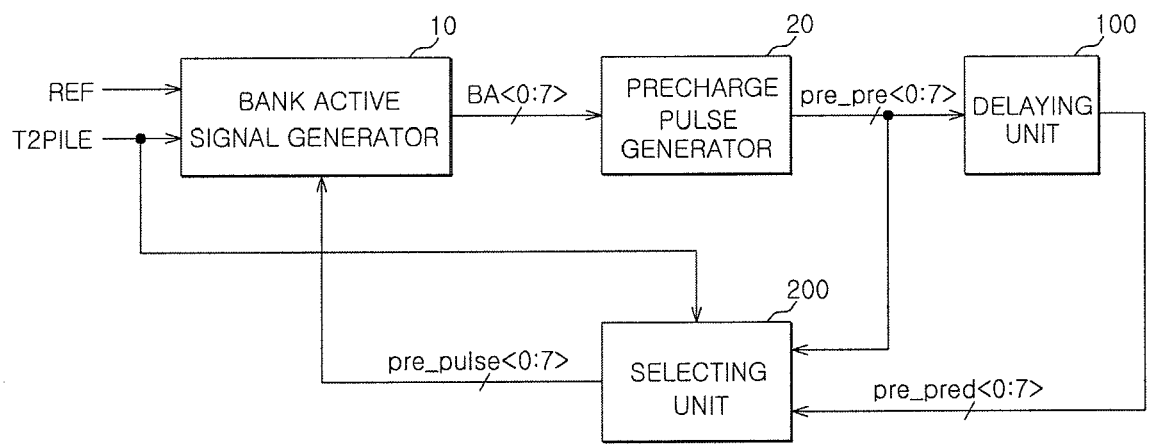
FIG. 2 is a schematic block diagram of an exemplary refresh circuit of a semiconductor memory apparatus according to one embodiment.

A refresh circuit of a semiconductor memory apparatus according to one embodiment can be configured to include a bank active signal generator 10, a precharge pulse generator 20, a delaying unit 100, and a selecting unit 200, as shown in FIG. 2.

When a refresh signal 'REF' is enabled, the bank active signal generator 10 can selectively enable first to eighth bank active signals 'BA<0:7>' in response to a piled signal 'T2PILE' and disable the first to eighth bank active signals 'BA<0:7>' in response to first to eighth precharge pulses 'pre_pulse<0:7>'.

For example, when the refresh signal 'REF' and the piled signal 'T2PILE' are enabled, the bank active signal generator 10 can enable a first group that consists of the second, fourth, fifth, and seventh bank active signals 'BA<1>', 'BA<3>', 'BA<4>', and 'BA<6>' and a second group that consists of the first, third, sixth, and eighth bank active signals 'BA<0>', 'BA<2>', 'BA<5>', and 'BA<7>' in sequence, among the first to eighth bank active signals 'BA<0:7>'.

Further, when the refresh signal 'REF' is enabled and the piled signal 'T2PILE' is disabled, the bank active signal generator 10 can firstly enable a first group that consists of the fourth and fifth bank active signals 'BA<3>' and 'BA<4>', secondly enable a second group that consists of the third and sixth bank active signals 'BA<2>' and 'BA<5>', thirdly enable a third group that consists of the second and seventh bank active signals 'BA<1>' and 'BA<6>', and lastly enable a fourth group that consists of the first and eighth bank active signals 'BA<0>' and 'BA<7>', among the first to eighth bank active signals 'BA<0>' to 'BA<7>' in sequence, Further, when the first to eighth precharge pulses 'pre_pulse<0:7>' are inputted, the bank active signal generator 10 can disable the corresponding bank active signals 'BA<0:7>'. For example, the bank active signal generator 10 can disable the first bank active signal 'BA<0>' when the first precharge pulse 'pre_pulse<0>' is inputted, the second bank active signal 'BA<1>' when the second precharge pulse 'pre_pulse<1>' is inputted, the third bank active signal 'BA<2>' when the third precharge pulse 'pre_pulse<2>' is inputted, the fourth bank active signal 'BA<3>' when the fourth precharge pulse 'pre_pulse<3>' is inputted, the fifth bank active signal 'BA<4>' when the fifth precharge pulse 'pre_pulse<4>' is inputted, the sixth bank active signal 'BA<5>' when the sixth precharge pulse 'pre_pulse<5>' is inputted, the seventh bank active signal 'BA<6>' when the seventh precharge pulse 'pre_pulse<6>' is inputted, and the eighth bank active signal 'BA<7>' when the eighth precharge pulse 'pre_pulse<7>' is inputted.

The piled signal 'T2PILE' is a signal for selecting a 2 piled refresh mode in which a plurality of bank active signals are classified into two groups, which are sequentially enabled at the time when the semiconductor memory apparatus performs the refresh operation and a 4 piled refresh mode in which the plurality of bank active signals are classified into four groups, which are sequentially enabled.

The precharge pulse generator 20 can generate each of first to eighth preliminary precharge pulses 'pre_pre<0:7>' after a set time from the time when each of the first to eighth bank active signals 'BA<0:7>' is enabled.

For example, the precharge pulse generator 20 can generate the first preliminary precharge pulse 'pre_pre<0>' after the set time from the time when the first bank active signal 'BA<0>' is enabled, the second preliminary precharge pulse 'pre_pre<1>' after the set time from the time when the second bank active signal 'BA<1>' is enabled, the third preliminary precharge pulse 'pre_pre<2>' after the set time from the time when the third bank active signal 'BA<2>' is enabled, the fourth preliminary precharge pulse 'pre_pre<3>' after the set time from the time when the fourth bank active signal 'BA<3>' is enabled, the fifth preliminary precharge pulse 'pre_pre<4>' after the set time from the time when the fifth bank active signal 'BA<4>' is enabled, the sixth preliminary precharge pulse 'pre_pre<5>' after the set time from the time when the sixth bank active signal 'BA<5>' is enabled, the seventh preliminary precharge pulse 'pre_pre<6>' after the set time from the time when the seventh bank active signal 'BA<6>' is enabled, and the eighth preliminary precharge pulse 'pre_pre<7>' after the set time from the time when the eighth bank active signal 'BA<7>' is enabled.

The delaying unit 100 can generate first to eighth preliminary delay precharge pulses 'pre_pred<0:7>' by delaying the first to eighth preliminary precharge pulses 'pre_pre<0:7>'. The delaying unit 100 is provided with delay circuits for delaying the first to eighth preliminary precharge pulses 'pre_pre<0:7>'. The delay circuits of the delaying unit 100 can be implemented by general delay circuits. Therefore, description of configurations and operations thereof will be omitted.

The selecting unit 200 can output the first to eighth preliminary precharge pulses 'pre_pre<0:7>' or the first to eighth preliminary delay precharge pulses 'pre_pred<0:7>' as the first to eighth precharge pulses 'pre_pulse<0:7>' in response to the piled signal 'T2PILE'.

For example, when the piled signal 'T2PILE' is disabled, the selecting unit 200 can output the first to eighth preliminary precharge pulses 'pre_pre<0:7>' as the first to eighth precharge pulses 'pre_pulse<0:7>'. Further, when the piled signal 'T2PILE' is enabled, the selecting unit 200 can output the first to eighth preliminary delay precharge pulses 'pre_pred<0:7>' as the first to eighth precharge pulses 'pre_pulse<0:7>'.

Figure 3:
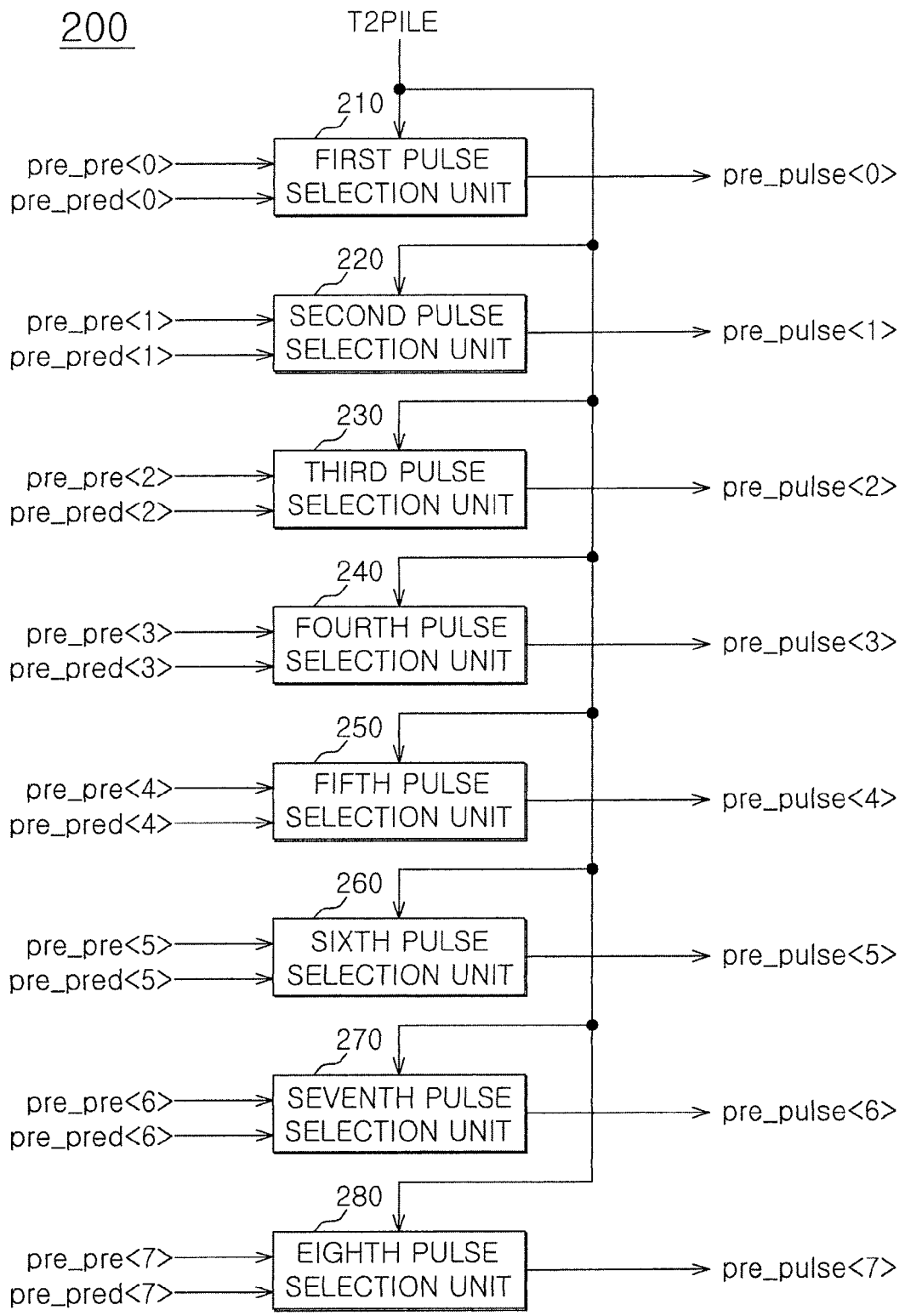
FIG. 3 is a schematic block diagram of an exemplary selecting unit of FIG. 2 according to one embodiment.

As shown in FIG. 3, the selecting unit 200 can include first to eighth pulse selection units 210 to 280. The selecting unit 200 may also be combined with the delaying unit 100 into a delay selecting unit.

The first pulse selection unit 210 can output the first preliminary precharge pulse 'pre_pre<0>' as the first precharge pulse 'pre_pulse<0>' when the piled signal 'T2PILE' is disabled and the first preliminary delay precharge pulse 'pre_pred<0>' as the first precharge pulse 'pre_pulse<0>' when the piled signal 'T2PILE' is enabled.

The second pulse selection unit 220 can output the second preliminary precharge pulse 'pre_pre<1>' as the second precharge pulse 'pre_pulse<1>' when the piled signal 'T2PILE' is disabled and the second preliminary delay precharge pulse 'pre_pred<1>' as the second precharge pulse 'pre_pulse<1>' when the piled signal 'T2PILE' is enabled.

The third pulse selection unit 230 can output the third preliminary precharge pulse 'pre_pre<2>' as the third precharge pulse 'pre_pulse<2>' when the piled signal 'T2PILE' is disabled and the third preliminary delay precharge pulse 'pre_pred<2>' as the third precharge pulse 'pre_pulse<2>' when the piled signal 'T2PILE' is enabled.

The fourth pulse selection unit 240 can output the fourth preliminary precharge pulse 'pre_pre<3>' as the fourth precharge pulse 'pre_pulse<3>' when the piled signal 'T2PILE' is disabled and the fourth preliminary delay precharge pulse 'pre_pred<3>' as the fourth precharge pulse 'pre_pulse<3>' when the piled signal 'T2PILE' is enabled.

The fifth pulse selection unit 250 can output the fifth precharge pulse 'pre_pre<4>' as the fifth precharge pulse 'pre_pulse<4>' when the piled signal 'T2PILE' is disabled and the fifth preliminary delay precharge pulse 'pre_pred<4>' as the fifth precharge pulse 'pre_pulse<4>' when the piled signal 'T2PILE' is enabled.

The sixth pulse selection unit 260 can output the sixth preliminary precharge pulse 'pre_pre<5>' as the sixth precharge pulse 'pre_pulse<5>' when the piled signal 'T2PILE' is disabled and the sixth preliminary delay precharge pulse 'pre_pred<5>' as the sixth precharge pulse 'pre_pulse<5>' when the piled signal 'T2PILE' is enabled.

The seventh pulse selection unit 260 can output the seventh preliminary precharge pulse 'pre_pre<6>' as the seventh precharge pulse 'pre_pulse<6>' when the piled signal 'T2PILE' is disabled and the seventh preliminary delay precharge pulse 'pre_pred<6>' as the seventh precharge pulse 'pre_pulse<6>' when the piled signal 'T2PILE' is enabled.

The eighth pulse selection unit 280 can output the eighth preliminary precharge pulse 'pre_pre<7>' as the eighth precharge pulse 'pre_pulse<7>' when the piled signal 'T2PILE' is disabled and the eighth preliminary delay precharge pulse 'pre_pred<7>' as the eighth precharge pulse 'pre_pulse<7>' when the piled signal 'T2PILE' is enabled. At this time, each of the first to eighth pulse selection units 210 to 280 can be implemented by a multiplexer.

An exemplary operation of the refresh circuit of the semiconductor memory apparatus according to one embodiment will be described below.

When the refresh signal 'REF' and the piled signal 'T2PILE' are enabled, the bank active signal generator 10 can enable the first group that consists of the second, fourth, fifth, and seventh bank active signals 'BA<1>', 'BA<3>', 'BA<4>', and 'BA<6>' and the second group that consists of the first, third, sixth, and eighth bank active signals 'BA<0>', 'BA<2>', 'BA<5>', and 'BA<7>' in sequence, among the first to eighth bank active signals 'BA<0:7>'. Further, when the refresh signal 'REF' is enabled and the piled signal 'T2PILE' is disabled, the bank active signal generator 10 can firstly enable the first group that consists of the fourth and fifth bank active signals 'BA<3>' and 'BA<4>' secondly enable the second group that consists of the third and sixth bank active signals 'BA<2>' and 'BA<5>', thirdly enable the third group that consists of the second and seventh bank active signals 'BA<1>' and 'BA<6>', and lastly enable the fourth group that consists of the first and eighth bank active signals 'BA<0>' and 'BA<7>', among the first to eighth bank active signals 'BA<0>' to 'BA<7>' in sequence.

The precharge pulse generator 20 can generate the first preliminary precharge pulse 'pre_pre<0>' after a set time from the time when the first bank active signal 'BA<0>' is enabled, the second preliminary precharge pulse 'pre_pre<1>' after the set time from the time when the second bank active signal 'BA<1>' is enabled, the third preliminary precharge pulse 'pre_pre<2>' after the set time from the time when the third bank active signal 'BA<2>' is enabled, the fourth preliminary precharge pulse 'pre_pre<3>' after the set time from the time when the fourth bank active signal 'BA<3>' is enabled, the fifth preliminary precharge pulse 'pre_pre<4>' after the set time from the time when the fifth bank active signal 'BA<4>' is enabled, the sixth preliminary precharge pulse 'pre_pre<5>' after the set time from the time when the sixth bank active signal 'BA<5>' is enabled, the seventh preliminary precharge pulse 'pre_pre<6>' after the set time from the time when the seventh bank active signal 'BA<6>' is enabled, and the eighth preliminary precharge pulse 'pre_pre<7>' after the set time from the time when the eighth bank active signal 'BA<7>' is enabled.

The delaying unit 100 can generate the first to eighth preliminary delay precharge pulses 'pre_pred<0:7>' by delaying the first to eighth preliminary precharge pulses 'pre_pre<0:7>'.

The selecting unit 200 can output the first to eighth preliminary precharge pulses 'pre_pre<0:7>' as the first to eighth precharge pulses 'pre_pulse<0:7>' when the piled signal 'T2PILE' is disabled and the first to eighth preliminary delay precharge pulses 'pre_pred<0:7>' as the first to eighth precharge pulses 'pre_pulse<0:7>' when the piled signal 'T2PILE' is enabled.

When the first to eighth precharge pulses 'pre_pulse<0:7>' are inputted, the bank active signal generator 10 can disable the corresponding bank active signals 'BA<0:7>'. For example, the bank active signal generator 10 can disable the first bank active signal 'BA<0>' when the first precharge pulse 'pre_pulse<0>' is inputted, the second bank active signal 'BA<1>' when the second precharge pulse 'pre_pulse<1>' is inputted, the third bank active signal 'BA<2>' when the third precharge pulse 'pre_pulse<2>' is inputted, the fourth bank active signal 'BA<3>' when the fourth precharge pulse 'pre_pulse<3>' is inputted, the fifth bank active signal 'BA<4>' when the fifth precharge pulse 'pre_pulse<4>' is inputted, the sixth bank active signal 'BA<5>' when the sixth precharge pulse 'pre_pulse<5>' is inputted, the seventh bank active signal 'BA<6>' when the seventh precharge pulse 'pre_pulse<6>' is inputted, and the eighth bank active signal 'BA<7>' when the eighth precharge pulse 'pre_pulse<7>' is inputted.

Consequently, a refresh circuit of a semiconductor memory apparatus according to one embodiment can disable a bank active signal at the timing later than when a piled signal is disabled when the piled signal is enabled (2 piled refresh mode) by generating a precharge pulse at the timing later than when the piled signal is disabled (4 piled refresh mode in which a plurality of bank active signals are classified into four groups and are enabled in sequence) when the piled signal is disabled (2 piled refresh mode in which the plurality of bank active signals are classified into two groups).

That is, the refresh circuit of the semiconductor memory apparatus according to one embodiment can improve a refresh characteristic by securing a bank activation time more sufficient than the related art in the case of the 2 piled refresh mode.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A refresh circuit of a semiconductor memory apparatus, comprising:
    a bank active signal generator configured to selectively enable a plurality of bank active signals in response to a piled signal and disable the plurality of bank active signals in response to a plurality of precharge pulses when a refresh signal is enabled;
    a precharge pulse generator configured to generate a plurality of preliminary precharge pulses in response to the plurality of bank active signals;

a delaying unit configured to generate a plurality of preliminary delay precharge pulses by delaying the plurality of preliminary precharge pulses; and a selecting unit configured to selectively output the plurality of preliminary precharge pulses or the plurality of preliminary delay precharge pulses as the plurality of precharge pulses in response to the piled signal.

2. The refresh circuit of claim 1, wherein the piled signal is a signal selected to allow the semiconductor memory apparatus to perform a refresh operation in a 2 piled refresh mode or a 4 piled refresh mode.

3. The refresh circuit of claim 2, wherein the back active signal generator is configured to classify the plurality of bank active signals into two groups and enable the groups in sequence when the refresh signal and the piled signal are enabled, and classify the plurality of bank active signals into four groups and enable the groups in sequence when the refresh signal is enabled and the piled signal is disabled.

4. The refresh circuit of claim 3, wherein the bank active signal generator is configured to receive the plurality of precharge pulses and disable the bank active signals that correspond to the inputted precharge pulses.

5. The refresh circuit of claim 1, wherein the precharge pulse generator is configured to receive the plurality of bank active signals and generate the preliminary precharge pulses that correspond to the received bank active signals.

6. The refresh circuit of claim 1, wherein the selecting unit is configured to output the plurality of preliminary delay precharge pulses as the plurality of precharge pulses when the piled signal is enabled and output the plurality of preliminary precharge pulses as the plurality of precharge pulses when the piled signal is disabled.

7. A refresh circuit of a semiconductor memory apparatus, comprising:

a bank active signal generator configured to enable bank active signals in response to a refresh signal and a piled signal and disable the bank active signals in response to precharge pulses;

a precharge pulse generator configured to generate preliminary precharge pulses in response to the bank active signals; and a delay selecting unit configured to output the preliminary precharge pulses as the precharge pulses or delay the preliminary precharge pulses to output preliminary delay precharge pulses as the precharge pulses in response to the piled signal.

8. The refresh circuit of claim 7, wherein the piled signal as a signal for selecting a refresh mode of the semiconductor memory apparatus is a signal to allow the semiconductor memory apparatus to perform a refresh operation by classifying a plurality of banks into two or four groups.

9. The refresh circuit of claim 8, wherein the delay selecting unit includes:

a delaying unit configured to delay the preliminary precharge pulses to obtain the preliminary delay precharge pulses; and a selecting unit configured to output one of the preliminary precharge pulses and the preliminary delay precharge pulses as the precharge pulses in response to the piled signal.

* * * * *